United States Patent
Yamaguchi et al.

(10) Patent No.: US 9,530,677 B2
(45) Date of Patent: Dec. 27, 2016

(54) SUBSTRATE PROCESSING APPARATUS AND SEMICONDUCTOR DEVICE MANUFACTURING METHOD

(71) Applicant: HITACHI KOKUSAI ELECTRIC INC., Tokyo (JP)

(72) Inventors: Takatomo Yamaguchi, Toyama (JP); Akinori Tanaka, Toyama (JP); Daisuke Hara, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 817 days.

(21) Appl. No.: 13/689,831

(22) Filed: Nov. 30, 2012

(65) Prior Publication Data

US 2013/0109193 A1 May 2, 2013

Related U.S. Application Data

(63) Continuation of application No. 11/991,937, filed as application No. PCT/JP2006/318818 on Sep. 22, 2006, now abandoned.

(51) Int. Cl.
  *H01L 21/677* (2006.01)
  *C23C 16/458* (2006.01)
  *C23C 16/54* (2006.01)

(52) U.S. Cl.
  CPC ....... *H01L 21/67742* (2013.01); *C23C 16/458* (2013.01); *C23C 16/4584* (2013.01); *C23C 16/54* (2013.01); *H01L 21/67757* (2013.01)

(58) Field of Classification Search
  CPC ........... C23C 16/4585; H01L 21/67303; H01L 21/67309; H01L 21/67757; H01L 21/67763; H01L 21/67775; H01L 21/67781
  See application file for complete search history.

(56) References Cited

U.S. PATENT DOCUMENTS 5,030,057 A   7/1991   Nishi et al. ................... 414/786
5,482,414 A   1/1996   Hayashi et al. .............. 409/134
(Continued)

FOREIGN PATENT DOCUMENTS

JP   63-89242    6/1988
JP   02-178945   7/1990
(Continued)

OTHER PUBLICATIONS

Hishitani et al., JP 2002-261035 (Machine Translation).*
(Continued)

*Primary Examiner* — Parviz Hassanzadeh
*Assistant Examiner* — Nathan K Ford
(74) *Attorney, Agent, or Firm* — Kratz, Quintos & Hanson, LLP

(57) ABSTRACT

A substrate processing apparatus comprises a processing chamber for storing a substrate and performing a specified processing on the substrate, a substrate holding jig for holding the substrate in the processing chamber, a placement stand capable of moving the substrate holding jig inside and outside the processing chamber while mounting the substrate holding jig, a substrate holding jig movement mechanism for moving the substrate holding jig to a location different from the placement stand while holding the substrate holding jig, and a substrate holding jig movement suppression mechanism for suppressing vertical and horizontal movement of the substrate holding jig in order to keep the substrate holding jig mounted on the placement unit of the substrate holding jig movement mechanism.

8 Claims, 15 Drawing Sheets

(56) References Cited

U.S. PATENT DOCUMENTS

| | | | |
|---|---|---|---|
| 5,829,969 A * | 11/1998 | Miyashita | C30B 35/005 |
| | | | 432/241 |
| 5,832,977 A | 11/1998 | Hampton | 144/144.51 |
| 5,980,195 A | 11/1999 | Miyashita | 414/783 |
| 6,174,011 B1 | 1/2001 | Keigler | 294/99.1 |
| 6,540,469 B2 | 4/2003 | Matsunaga et al. | 414/416.08 |
| 6,689,264 B1 | 2/2004 | Belisle et al. | 204/298.15 |
| 7,455,734 B2 | 11/2008 | Yamaguchi et al. | 118/728 |
| 7,463,824 B2 | 12/2008 | Yumiki et al. | 396/72 |
| 7,570,876 B2 | 8/2009 | De Ridder | 392/416 |
| 7,654,742 B2 | 2/2010 | Nishimoto et al. | 384/107 |
| 7,684,895 B2 | 3/2010 | Rice et al. | 700/245 |
| 7,689,110 B2 | 3/2010 | Yumiki et al. | 396/72 |
| 7,922,485 B2 | 4/2011 | Nitadori et al. | 432/241 |
| 2002/0012581 A1 | 1/2002 | Odake et al. | 414/804 |

FOREIGN PATENT DOCUMENTS

| | | |
|---|---|---|
| JP | 04-120724 | 4/1992 |
| JP | 11-074205 | 3/1999 |
| JP | 11-219912 | 8/1999 |
| JP | 2001-338888 | 12/2001 |
| JP | 2002-261035 | 9/2002 |
| JP | 2003-258063 | 9/2003 |
| JP | 2004-071618 | 3/2004 |

OTHER PUBLICATIONS

Notice of Reasons for Rejection issued in counterpart application from the Korean Intellectual Property Office mailed May 18, 2009 with English translation (10pages).

* cited by examiner

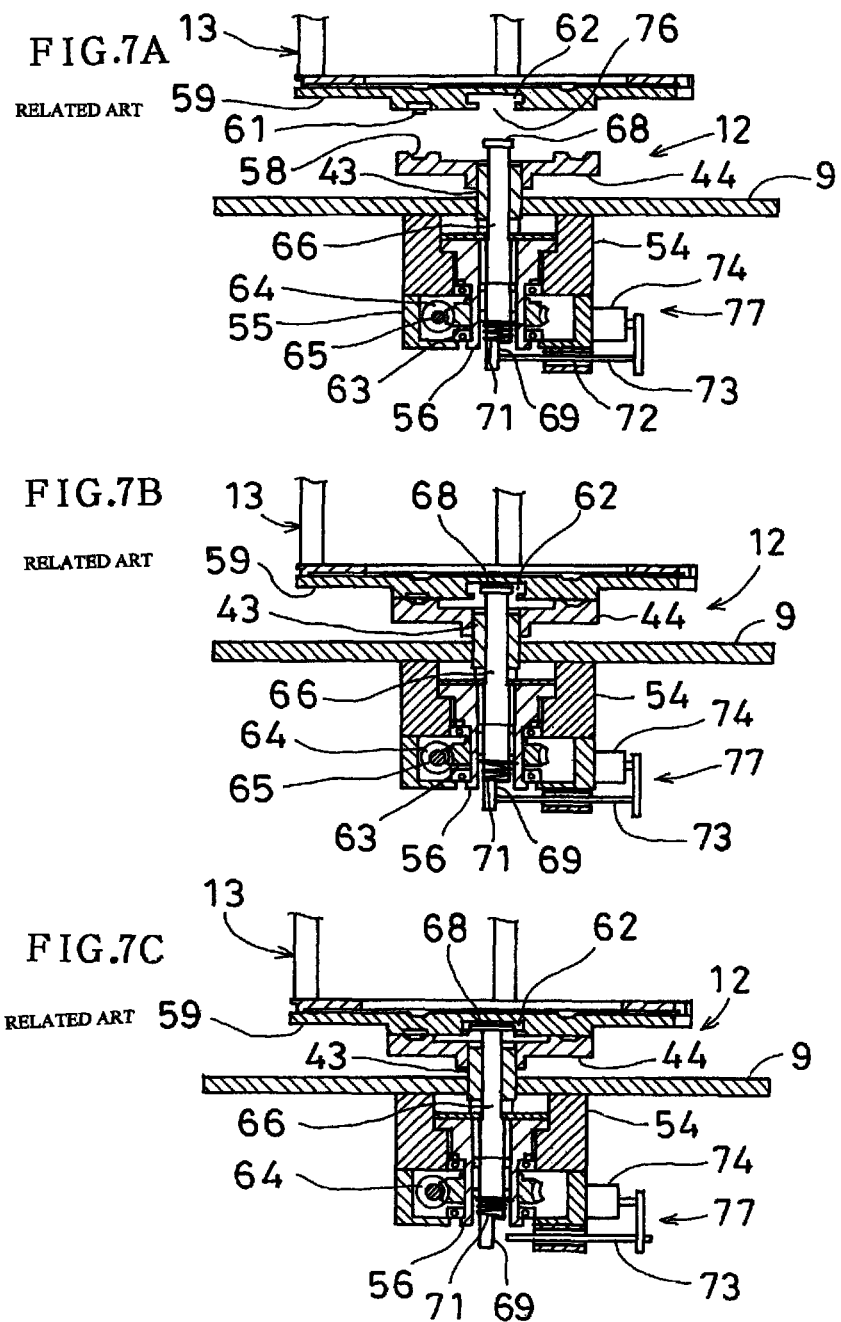

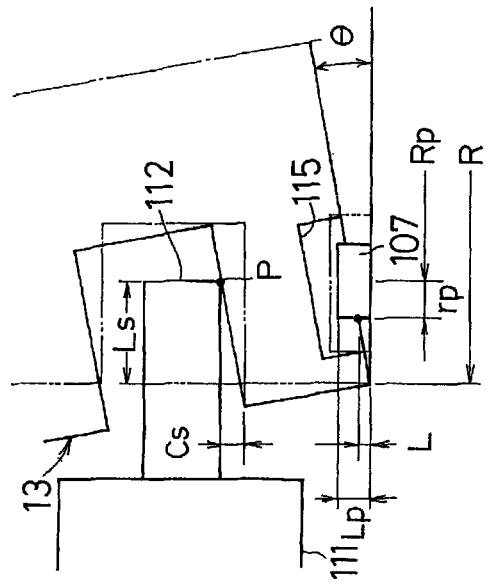
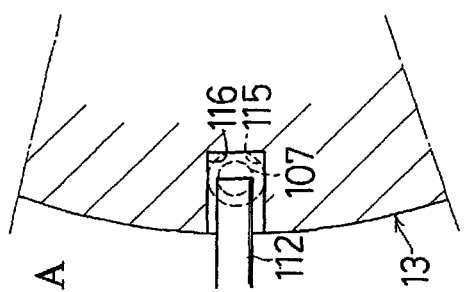
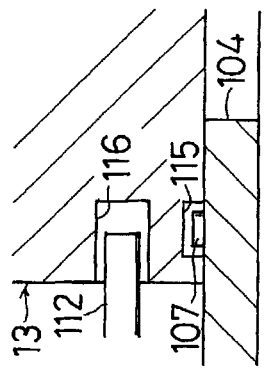

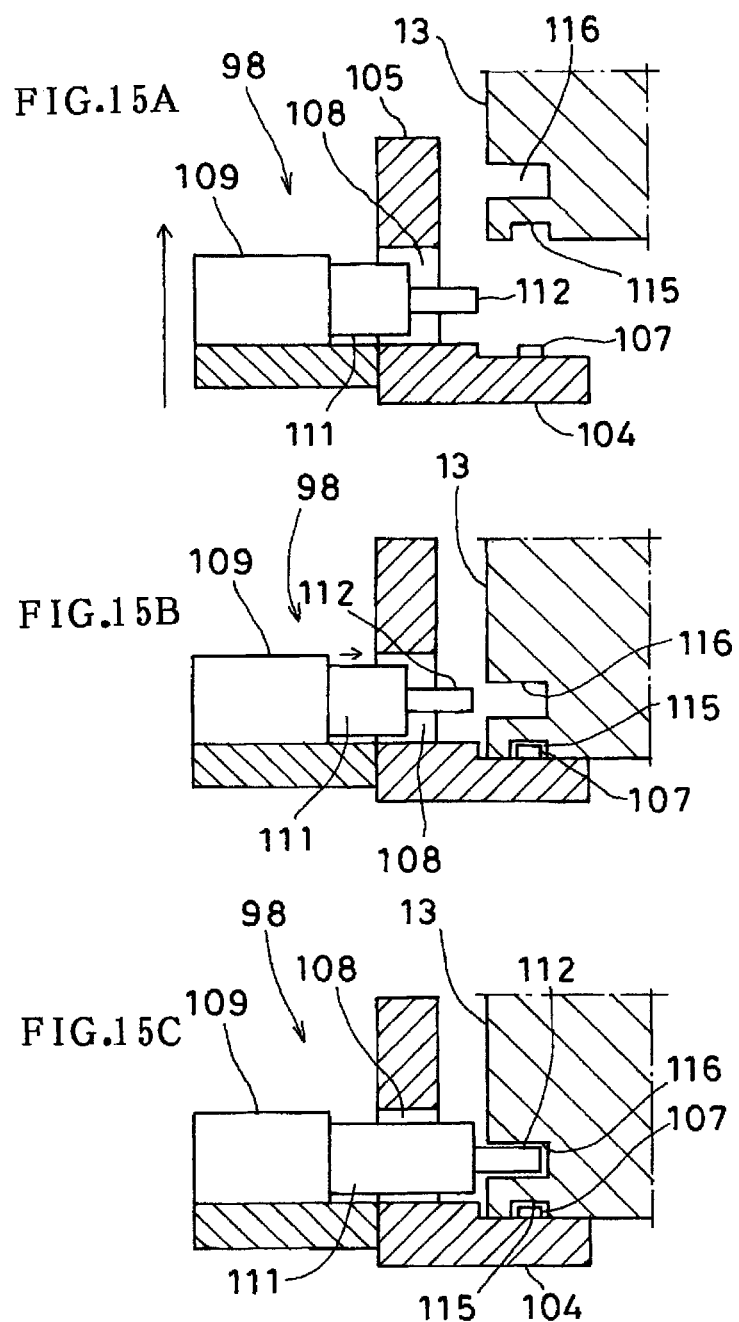

SUBSTRATE PROCESSING APPARATUS AND SEMICONDUCTOR DEVICE MANUFACTURING METHOD

RELATED APPLICATIONS

This application is a continuation of U.S. patent application Ser. No. 11/991,937, filed Mar. 13, 2008, now abandoned, which application is a 371 of PCT/JP2006/318818, filed Sep. 22, 2006, which application claims priority of Japanese Application No. 2005-291784, filed Oct. 4, 2005, and Japanese Application No. 2005-293858, filed Oct. 6, 2005, the entire contents of which are incorporated herein by reference.

TECHNICAL FIELD

The present invention relates to a substrate processing apparatus for processing substrates such as silicon wafers by performing CVD, dry etching, sputtering, and a semiconductor device manufacturing method by utilizing that apparatus, and relates in particular to a substrate processing apparatus containing a transfer device for transferring a substrate holding jig such as a boat.

BACKGROUND ART

The substrate processing apparatus is an apparatus for manufacturing semiconductor devices by performing a specified process such as CVD, dry etching, or sputtering on a substrate such as a silicon wafer.

Substrate processing apparatus are grouped into single-wafer type substrate processing apparatus for processing one substrate at a time; and batch-type substrate processing apparatus for processing a specified number of substrates at one time.

In methods for manufacturing semiconductor integrated circuit devices (hereinafter, called "IC"), vertical diffusion CVD apparatus are used in processes for forming a film and diffusing on the wafer.

Conventional vertical diffusion CVD apparatus of this type include a boat movement mechanism for moving a boat holding multiple wafers. This boat movement mechanism is structured to move the boat between a wafer transfer position, and a boat loading and unloading furnace position, and a wafer cooling position. This boat movement mechanism is disclosed for example in the patent document 1.

Namely, the boat movement mechanism for this type of vertical diffusion CVD apparatus contains two boat support arms each capable of swiveling and moving up and down. The boat movement mechanism is structured to support the boat by the boat support arms and to move the boat between the mount stand at the wafer transfer position, the boat loading and unloading furnace position, and the mount stand at the wafer cooling position.

The patent document 2 for example discloses a boat locking mechanism for locking the boat on the mount stands at the wafer transfer position and at the wafer cooling position, and the boat elevator for raising and lowering the boat and loading and unloading the boat into and from the reaction furnace.

However, this boat locking mechanism cannot lock the boat while the boat is moving between the wafer transfer position and boat loading and unloading furnace position and wafer cooling position, and therefore cannot prevent the boat from tipping over.

The patent document 3 on the other hand, discloses a boat locking mechanism containing an anti-tipping damper on the boat support arm to prevent the boat from tipping over during movement.

Patent document 1: Japanese Patent Non-Examined Publication No. 2001-338888
Patent document 2: Japanese Patent Non-Examined Publication No. 2003-258063
Patent document 3: Japanese Patent Non-Examined Publication No. 2004-71618

DISCLOSURE OF INVENTION

Problems to be Solved by the Invention

The substrate processing apparatus in the patent document 2 and the substrate processing apparatus in the patent document 3 each include measures to prevent the boat from tipping over. However, the patent document 2 and the patent document 3 do not include measures for preventing the boat from tipping over while the boat exchanger device is transferring the boat, and while the boat exchanger device is delivering the boat to the boat transfer position.

The technology cannot predict at what time phenomena such as earthquakes will occur, so if an earthquake occurs during substrate processing in the substrate processing apparatus, while the boat exchanger device is transferring the boat, or while the boat exchanger device is delivering the boat to the boat transfer position, then the boat might tip over or become damaged.

Moreover, the boat lock mechanism with an anti-tipping damper mounted on the boat support arm has the following problems.

1) There is a gap due to the difference between the height the anti-tipping damper on the boat support arm inserts into the boat, and the height while the boat is raised, so that completely preventing a moving boat from tipping over is impossible.

2) Unless tipping over of the boat and boat sideways movement are completely confined, the boat will move sideways during intermittent vibrations such as an earthquake.

3) Deflection occurs to some extend since the boat support arm supports the boat on one side. The extent of this deflection varies due to the difference when there are boats or not, and the number of wafers held in the boat. Therefore, even if the horizontal levelness is adjusted under specified conditions, the levelness will vary due to the difference in deflection, causing the boat to move sideways.

4) When the boat moves in a direction where there is no support section (section where boat is not supported) on the boat support arm, the boat will shift due to inertia so that the boat will detach from the boat support arm.

5) Reducing the above mentioned gap is extremely difficult in view of the mechanical precision and the alignment task involved in the adjustment.

In order to resolve the aforementioned problems with the prior art, the present invention has an object of providing a substrate processing apparatus capable of reliably preventing a boat from tipping over.

Means to Solve the Problems

A typical aspect for resolving the aforementioned problems is described next.

(1) A substrate processing apparatus comprising:

a processing chamber for storing a substrate and performing a specified processing on the substrate, a substrate holding jig for holding the substrate in the processing chamber, a placement stand capable of moving the substrate holding jig inside and outside the processing chamber while mounting the substrate holding jig, a substrate holding jig movement mechanism for moving the substrate holding jig to a location different from the placement stand while holding the substrate holding jig, and a substrate holding jig movement suppression mechanism for suppressing vertical and horizontal movement of the substrate holding jig in order to keep the substrate holding jig mounted on the placement unit of the substrate holding jig movement mechanism.

Effects of Invention

The above aspect of the invention is capable of preventing the substrate holding jig from moving horizontally and vertically while the substrate holding jig movement mechanism is moving the substrate holding jig, by utilizing a substrate holding jig movement suppression mechanism to suppress the horizontal and vertical movement of the substrate holding jig in order to keep the substrate holding jig mounted on the placement unit in the substrate holding jig movement mechanism, and therefore renders the effect of securely preventing the substrate holding jig from tipping over.

BRIEF DESCRIPTION OF DRAWINGS

FIG. 7A is a drawing showing the linking and releasing operation of the boat anti-tipping mechanism;

FIG. 7B is a drawing showing the linking and releasing operation of the boat anti-tipping mechanism;

FIG. 7C is a drawing showing the linking and releasing operation of the boat anti-tipping mechanism;

FIG. 13A is a plan cross sectional view for showing the dimensional relationship of the horizontal pin and the perpendicular projection;

FIG. 13B is a side cross sectional view for showing the dimensional relationship of the horizontal pin and the perpendicular projection;

FIG. 13C is a diagrammatic view for showing the dimensional relationship of the horizontal pin and the perpendicular projection;

FIG. 15A is a drawing showing the linking and releasing operation of the boat anti-tipping mechanism;

FIG. 15B is a drawing showing the linking and releasing operation of the boat anti-tipping mechanism;

FIG. 15C is a drawing showing the linking and releasing operation of the boat anti-tipping mechanism;

BEST MODE FOR CARRYING OUT THE INVENTION

Figure 1:
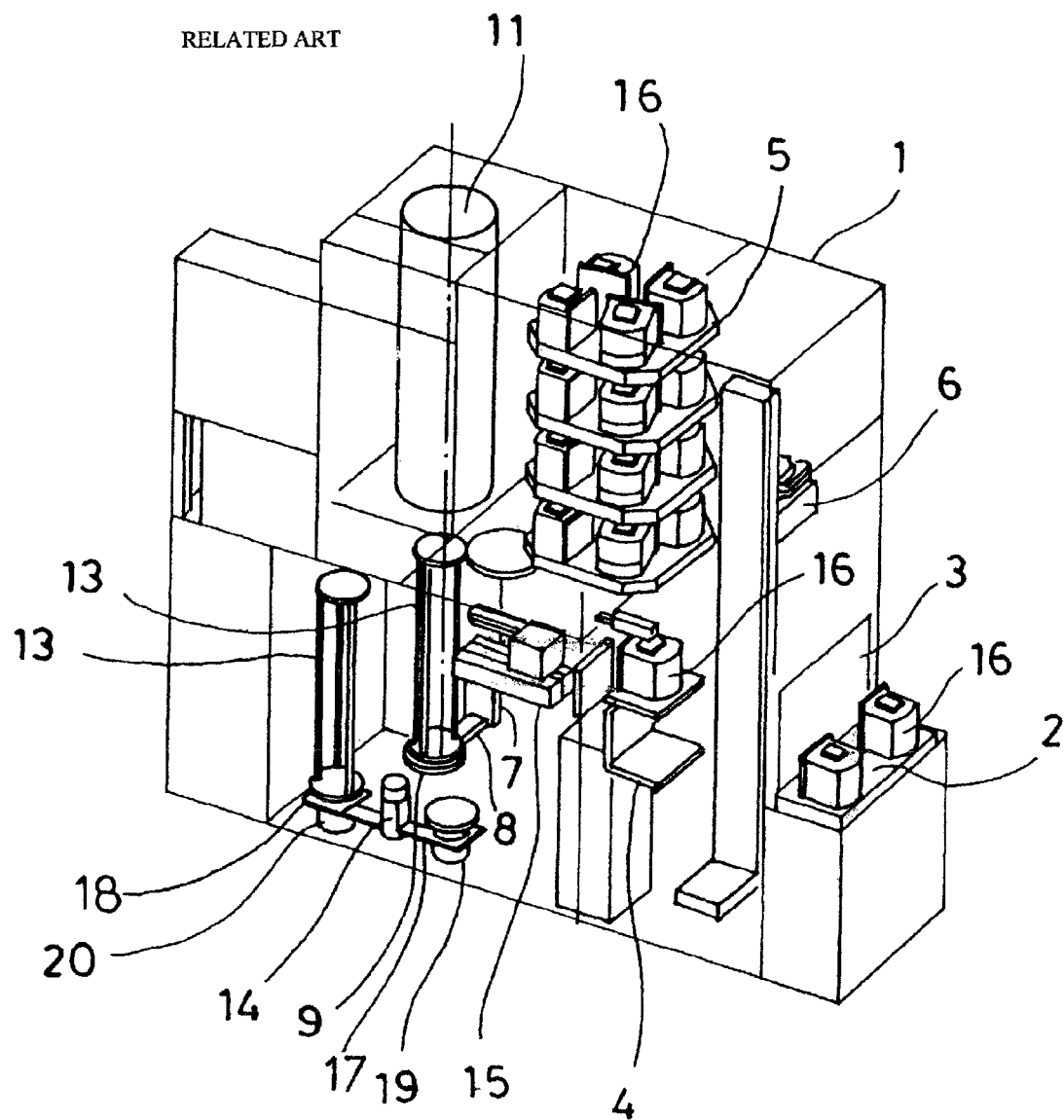
FIG. 1 is a perspective view showing a concept view of the substrate processing apparatus of the present invention.

The best embodiment for carrying out the present invention is described next while referring to the drawings.

Figure 2:
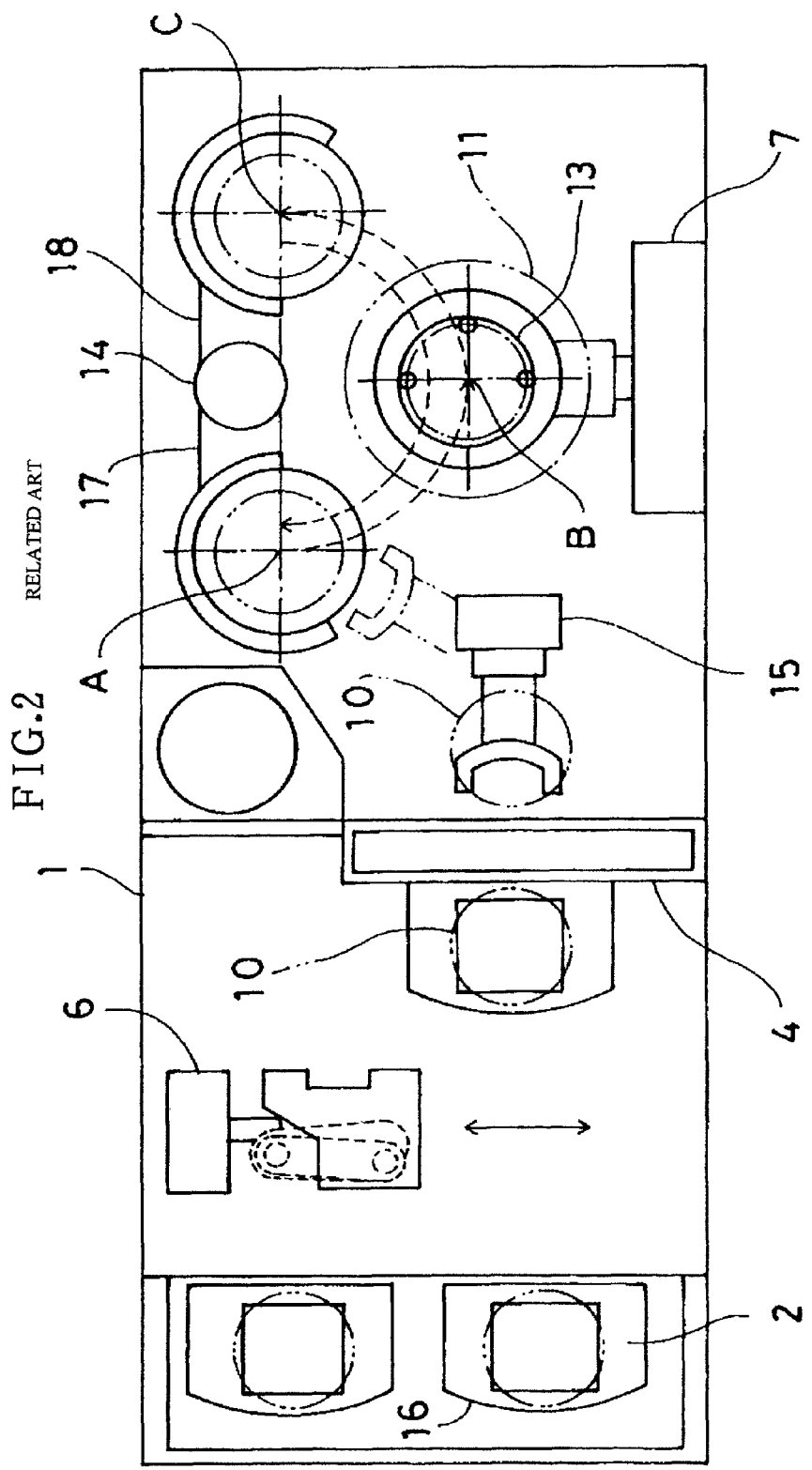
FIG. 2 is a plan view showing a concept view of the substrate processing apparatus of the present invention.

An overview of the substrate processing apparatus of the present invention is first of all described while referring to FIG. 1 and FIG. 2.

A cassette stage 2 is installed on the front side of a case 1. The cassette stage 2 is structured to give and receive a substrate transfer container (hereinafter called "cassette". This embodiment utilizes a sealed type cassette) to and from an external transfer device (not shown in drawing).

This cassette stage 2 connects by way of a shutter 3 with the inside of the case 1.

A cassette opener 4 is installed facing the cassette stage 2 on the front side within the case 1. A cassette stocker 5 is installed above the cassette opener 4. A cassette loader 6 serving as a cassette transport means is installed between the cassette stocker 5 and the cassette opener 4 and the cassette stage 2.

A boat elevator 7 serving as the boat movement mechanism is installed on the rear side within the case 1. A seal cap 9 is installed on an up and down arm 8 extending horizontally from that boat elevator 7. The seal cap 9 is structured to seal the furnace opening on a process furnace 11 including a processing chamber, and heating mechanism.

Figure 4:
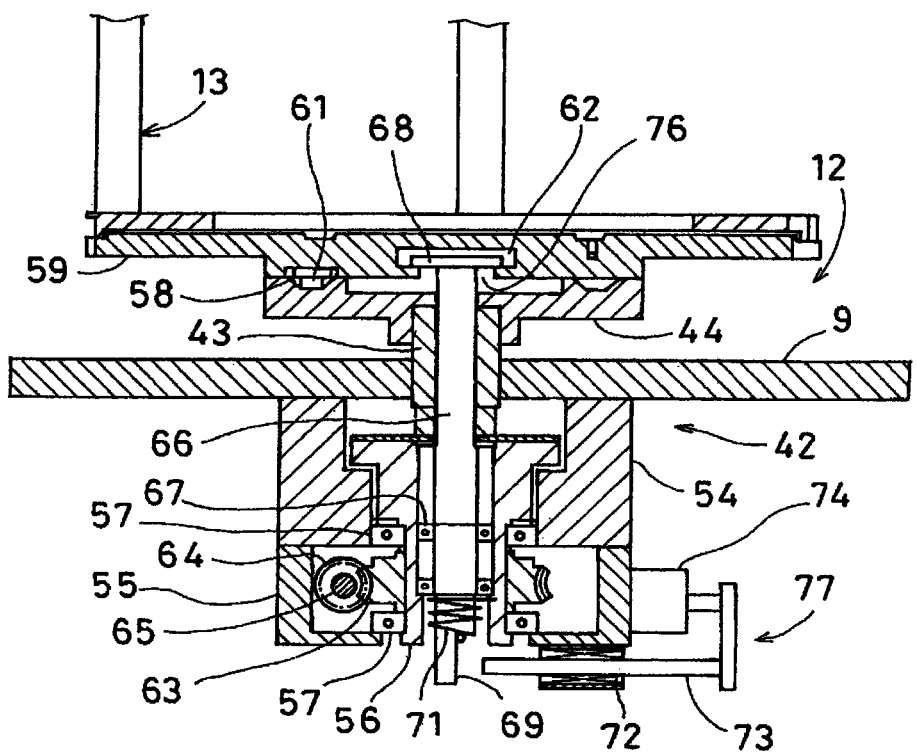
FIG. 4 is a cross sectional view showing the boat anti-tipping mechanism in the boat placement unit for the substrate processing apparatus.

A boat placement unit 12 (described later on in FIG. 4) is installed on the seal cap 9.

A boat (substrate holding jig) 13 holding substrates for processing (hereinafter called "wafers") 10 arrayed horizontally and in multiple steps, is mounted on the boat placement unit 12.

The boat placement unit 12 contains a boat placement plate 44 (described later on) as a placement stand. The boat placement unit 12 is structured to allow the boat 13 to swivel by way of the boat placement plate 44.

A boat exchanger device 14 is installed facing the boat elevator 7 on the rear side within the case 1. A substrate transfer device 15 is installed between the boat exchanger device 14 and the boat elevator 7 and the cassette opener 4.

The cassette stage 2 gives and receives the cassette 16 to and from the external transfer device not shown in the drawing, and also gives and receives the cassette 16 to and from the cassette loader 6.

The cassette loader 6 is capable of lateral, vertical, forward and reverse movement. The cassette loader 6 transfers the cassette 16 of the cassette stage 2 to the cassette opener 4 and the cassette stocker 5.

The cassette opener 4 opens and shuts the lid of the cassette 16.

The substrate transfer device 15 is capable of lateral, vertical, forward and reverse movement. The substrate transfer device 15 transfers the wafer 10 between the boat 13 and the cassette 16 on the cassette opener 4.

The boat exchanger device 14 contains two left boat support arm 17 and right boat support arm 18. The left boat support arm 17 and the right boat support arm 18 are capable of raising and lowering and swiveling movement separately. These boat support arms 17 and 18 move the boat 13 between the wafer transfer position A, boat delivering and receiving position B, and wafer cooling position C.

A boat stand 19 and a boat stand 20 are each installed at the wafer transfer position A, and wafer cooling position C, and the boat 13 is mounted on each boat stand 19 and boat stand 20.

The boat placement unit 12 receives the boat 13 holding the unprocessed wafers 10 at the boat delivering and receiving position B from the boat exchanger device 14. The boat elevator 7 carries the boat 13 into the processing chamber of the process furnace 11.

The wafers 10 are heated in the process furnace 11 and are processed by the required process gas supplied into the processing chamber.

In order to improve the uniformity of the formed film, the boat 13 is rotated during the wafer processing.

When the processing is complete, the boat elevator 7 unloads the boat 13 from the process furnace 11 to the boat delivering and receiving position B, and delivers the boat 13 to the boat exchanger device 14.

The boat 13 holding the now processed wafers 10 is moved to the wafer cooling position C, and placed on the boat stand 20, and then cooled until the specified temperature is reached.

During that time, the boat 13 holding the unprocessed wafers 10 is moved from the wafer transfer position A to the boat delivering and receiving position B and delivered to the boat placement unit 12. The boat elevator 7 then carries the boat 13 into the process furnace 11.

When the now processed wafers 10 have cooled to the specified temperature at the wafer cooling position C, the boat exchanger device 14 moves the boat 13 holding the processed wafers 10 to the wafer transfer position A, and places it on the boat stand 19.

The substrate transfer device 15 transfers the processed wafers 10 from the boat 13 at the wafer transfer position A to the cassette 16 on the cassette opener 4.

When the processed wafers 10 are charged into the cassette 16, the cassette loader 6 transfers the cassette 16 to the cassette stage 2, and an external transfer device carries it out.

When the cassette loader 6 transfers the cassette 16 filled with unprocessed wafers 10 to the cassette opener 4, the substrate transfer device 15 transfers the unprocessed wafers 10 from the cassette 16 to an empty boat 13 at the wafer transfer position A.

This wafer 10 processing is performed repeatedly.

Figure 3:
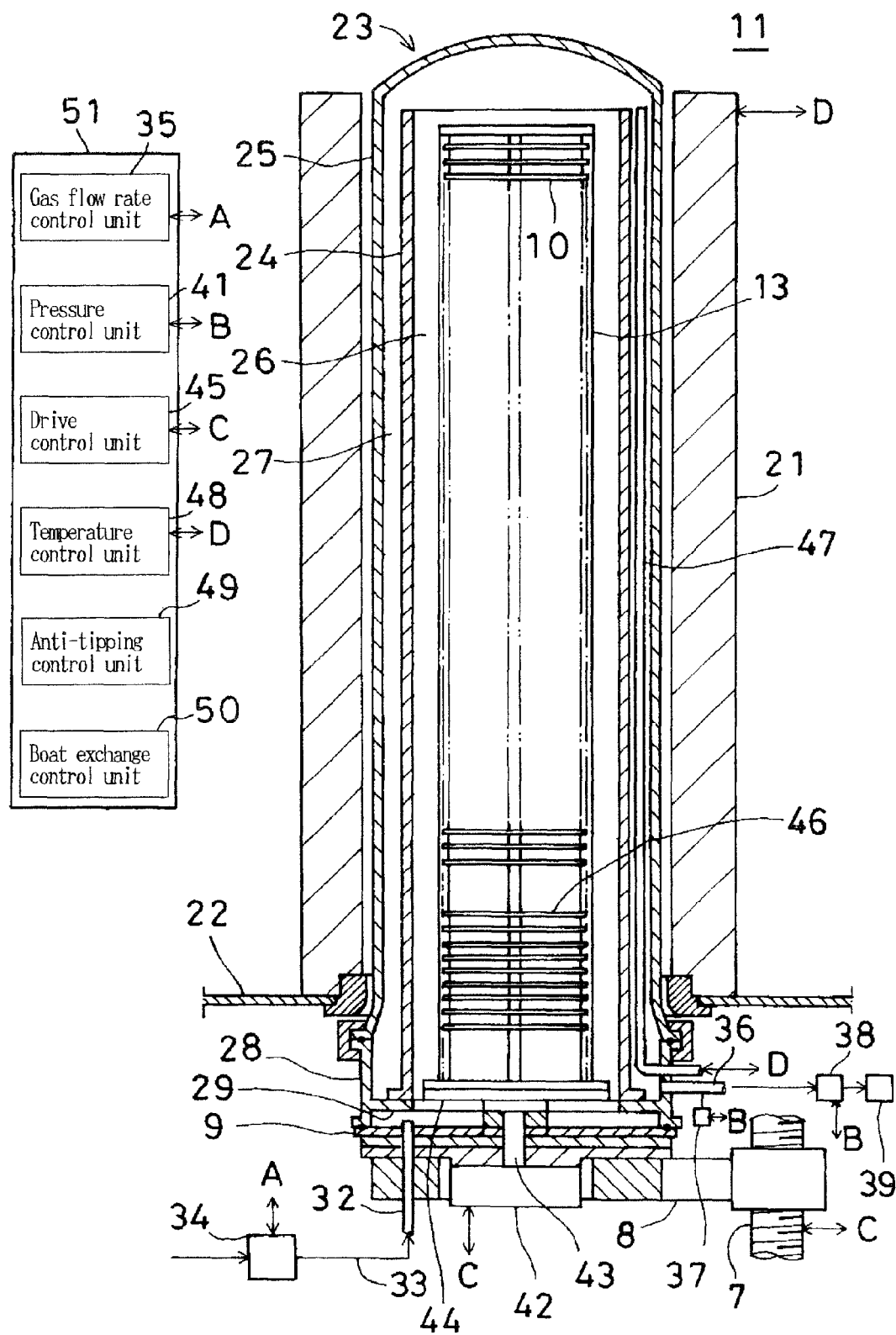
FIG. 3 is a cross sectional view showing an example of the process furnace utilized in this substrate processing apparatus.

The process furnace 11 is described next while referring to FIG. 3.

The process furnace 11 contains a heater 21 serving as the heating mechanism.

The heater 21 has a tubular shape and is installed perpendicular on the heater base 22.

A reaction tube 23 is installed inside the heater 21 and concentrically with the heater 21. This reaction tube 23 includes an internal reaction tube 24, and an external reaction tube 25 installed concentrically on the outer side of the internal reaction tube 24.

The internal reaction tube 24 is made from a heat-resistant material such as quartz ($SiO_2$) or silicon carbide (SiC). The internal reaction tube 24 is formed in a tubular shape open on the top and bottom ends.

The internal reaction tube 24 forms a processing chamber 26, and allows the processing chamber 26 to accommodate the boat 13 charged with the wafers 10.

The external reaction tube 25 is made from a heat-resistant material such as quartz or silicon carbide. The external reaction tube 25 is formed in a tubular shape sealed on the top end and open on the bottom end. The external reaction tube 25 forms a tubular shaped space 27 with the internal reaction tube 24.

The heater base 22 supports a manifold 28 (support structure is not shown in drawing).

The external reaction tube 25 is installed airtightly on the manifold 28.

The manifold 28 is formed for example from stainless steel. An internal flange 29 is formed on the inner tubular surface of the manifold 28. The internal reaction tube 24 is erected on this internal flange 29.

A nozzle 32 serving as the gas feed section is connected to the seal cap 9 to allow flow into the processing chamber 26. A gas supply pipe 33 is connected to the nozzle 32.

A process gas supply source and an inert gas supply source (not shown in drawing) are connected to the upper side of the gas supply pipe 33 by way of an MFC (mass flow controller) 34 as a gas flow regulator device.

A gas flow rate controller 35 is electrically connected to the MFC 34. The gas flow rate controller 35 regulates the MFC 34 so that gas is supplied at the desired amount and so that the gas flows at the desired timing.

An exhaust pipe 36 is installed on the manifold 28 to exhaust the atmosphere within the processing chamber 26. The exhaust pipe 36 is installed on the manifold 28 so as to connect to the bottom side of the space 27.

A pressure sensor 37 is installed as a pressure detector device on the exhaust pipe 36. The exhaust pipe 36 connects to a vacuum exhaust apparatus 39 such as a vacuum pump by way of a pressure adjuster device 38 such as a pressure control valve. The exhaust pipe 36 is structured to allow a vacuum exhaust so that the pressure inside the processing chamber 26 reaches a specified pressure (vacuum intensity).

A pressure control unit 41 electrically connects to the pressure sensor 37 and the pressure adjuster device 38. The pressure control unit 41 is structured to regulate the pressure adjuster device 38 at the desired timing based on the pressure detected by the pressure sensor 37. The pressure control unit 41 regulates the pressure adjuster device 38 to adjust the pressure in the processing chamber 26 to reach the desired pressure at the desired timing.

The lower end opening of the manifold 28 forms the furnace opening. The seal cap 9 is installed as the furnace opening lid below the manifold 28.

The seal cap 9 contacts the bottom end surface of the manifold 28 perpendicularly from the lower side, and can seal the furnace opening. The seal cap 9 is formed in a disk shape from a metal such as stainless steel.

A boat swivel mechanism 42 for rotating the boat, is installed concentrically with the seal cap 9 on the seal cap 9.

A boat swivel axis 43 of the boat swivel mechanism 42 is passed through the seal cap 9 and connects to the boat placement plate 44. The boat 13 is placed on the boat placement plate 44. The boat swivel mechanism 42 rotates the boat 13 by way of the boat swivel axis 43 and the boat placement plate 44.

The up and down arm 8 (See FIG. 1) supports the seal cap 9, and the boat elevator 7 raises and lowers the seal cap 9 by way of the up and down arm 8. The boat elevator 7 carries the boat 13 in and out of the processing chamber 26.

A drive controller unit 45 is electrically connected to the boat elevator 7 and the boat swivel mechanism 42. The drive controller unit 45 functions to control the boat swivel mechanism 42 and the boat elevator 7 to perform the desired operation at the desired, specified timing.

The boat 13 is formed from a heat-resistant material such as quartz or silicon carbide. The boat 13 is structured to horizontally hold a specified number of wafers 10 in multiple steps as described previously.

Multiple heat-insulating plates 46 serving as a heat-insulating member in a circular plate shape of heat-resistant material such as quartz or silicon carbide, are installed horizontally arrayed in multiple steps at the lower part of the boat 13. These heat-insulating plates 46 are structured to make it difficult for heat to propagate from the processing chamber 26 to the manifold 28 side.

A temperature sensor 47 is installed within the reaction tube 23. A temperature control unit 48 is electrically connected to the heater 21 and the temperature sensor 47.

The temperature control unit 48 regulates the heater unit 21 to heat the processing chamber 26 to the specified desired temperature distribution based on the temperature information detected by the temperature sensor 47.

A main control unit 51 includes the gas flow rate controller 35, the pressure control unit 41, the drive controller unit 45, the temperature control unit 48, an anti-tipping control unit 49 described later on, and a boat exchange control unit 50 for regulating the boat exchanger device 14, and this main control unit 51 controls the overall operation of the substrate processing apparatus.

The anti-tipping control unit 49 and boat exchange control unit 50 may be integrated into the drive controller unit 45.

The boat swivel mechanism 42 is described next while referring to FIG. 4 through FIG. 7.

A motor holder 54 is clamped to the bottom side of the seal cap 9. A speed reducer 55 is attached to the bottom side of the motor holder 54. A bearing 57 supports a hollow external swivel axis 56 that passes through the motor holder 54 and the speed reducer 55 to allow free swiveling movement of the external swivel axis 56. The boat swivel axis 43 installed integrally with the external swivel axis 56 passes through the seal cap 9 in a sealed state. The boat placement plate 44 is clamped to the upper edge of the boat swivel axis 43.

A tapered groove 58 is formed radiating in three directions on the upper surface of the boat placement plate 44.

A positioning pin 61 is formed protruding at a position divided in three equal parts on the periphery of the lower side of a boat bottom plate 59. The positioning pin 61 engages with the tapered groove 58 to position the boat 13 on the boat placement plate 44.

A lock hole 62 described later on is formed on the bottom side of the bottom plate 59 of the boat 13.

A worm wheel 63 is fit and clamped between the bearings 57, 57 of the external swivel axis 56. A worm 64 engages with the worm wheel 63. The worm 64 is clamped to an output axis 65 of the boat rotation motor (not shown in drawing).

The boat swivel mechanism 42 contains a swivel sensor (not shown in drawing) for detecting the swivel position of the external swivel axis 56. This swivel sensor detects the swivel position versus the seal cap 9 on the external swivel axis 56. This swivel sensor is structured to detect the external swivel axis 56 or in other words the reference position of the boat placement plate 44.

A boat lock shaft 66 is arrayed concentrically in the interior of the boat swivel axis 43 and the external swivel axis 56. A bearing 67 supports this boat lock shaft 66 for free rotation. This boat lock shaft 66 is sealed airtight.

Figure 5:
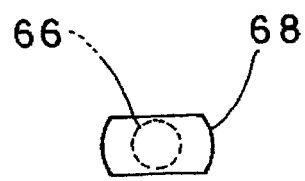
FIG. 5 is a plan view of the lock plate utilized in the boat anti-tipping mechanism.

This boat lock shaft 66 protrudes from the boat placement plate 44, and a lock plate 68 in a roughly rectangular shape as shown in FIG. 5 is clamped as a locking member on the protruding tip of the boat lock shaft 66.

A portion of the bottom end of the boat lock shaft 66 is cut. Accordingly, the bottom end has a semi-cylindrical shape to form a level surface 69. This level surface 69 protrudes below the lower side of the speed reducer 55.

A lock spring 71 functioning as a torsion coil spring is installed on the bottom end of the boat lock shaft 66. One end of this lock spring 71 is bent on the center side and hooked on the level surface 69. The other end of the lock spring 71 extends tangentially and hooks onto the external swivel axis 56.

Though not shown in particular in the drawings, a mechanical stopper is installed between the external swivel axis 56 and the boat lock shaft 66. An initial deflection is applied in the lock spring 71 to reliably abut the external swivel axis 56 against boat lock shaft 66.

A lock rod 73 is installed on the lower side of the speed reducer 55 to move via a slide bearing 72 in a direction intersecting the axial center of the boat lock shaft 66. The tip of the lock rod 73 can abut against the level surface 69. The stem end of the lock rod 73 connects to a lock actuator 74 functioning as a linear actuator such as a solenoid or a cylinder.

The advancing or retracting of the lock rod 73 by the lock actuator 74 makes the tip of the lock rod 73 come in contact with or separate from the level surface 69. Rotation of the boat lock shaft 66 is restricted when in a state where the lock rod 73 is contacting the level surface 69.

A boat anti-tipping mechanism 77 serving as the substrate holding jig movement suppression mechanism includes the lock plate 68, the load lock shaft 66, the lock spring 71, the lock rod 73 and the lock actuator 74, etc.

Methods to restrict rotation of the boat lock shaft 66 include installing a pin extending horizontally on the lower edge of the boat lock shaft 66 and installing a loading and unloading member on the pin rotating surface.

The lock hole 62 is formed on the boat bottom plate 59. This lock hole 62 is structure to latch and detach from the lock plate 68.

Figure 6A:
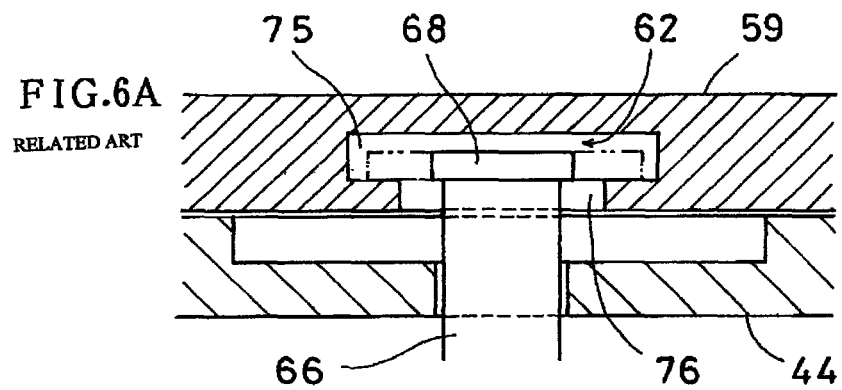
FIG. 6A is a drawing showing the linking and releasing operation of the lock section in the boat anti-tipping mechanism.

A circular cap hole 75 for the lock hole 62 is formed inside the boat bottom plate 59 as shown in FIG. 6A. The cap hole 75 is opened by a key hole 76.

Figure 6B:
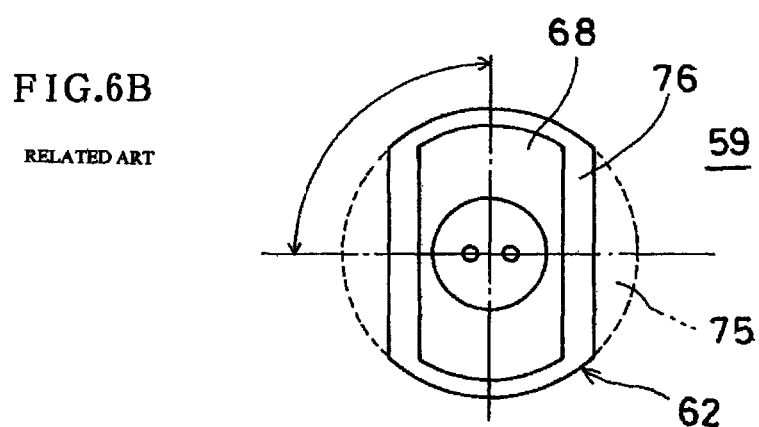
FIG. 6B is a drawing showing the linking and releasing operation of the lock section in the boat anti-tipping mechanism.
Figure 6C:
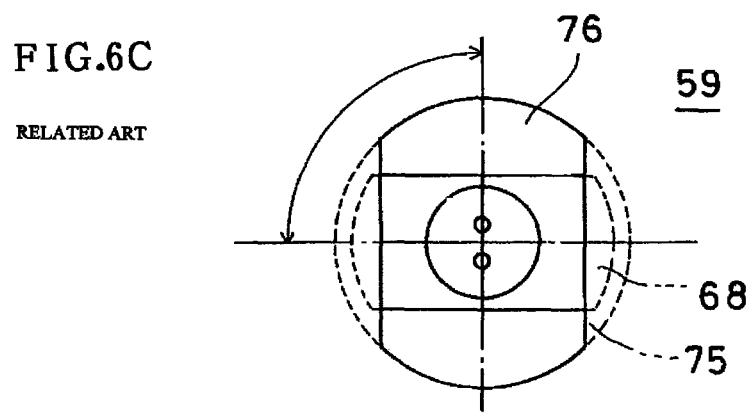
FIG. 6C is a drawing showing the linking and releasing operation of the lock section in the boat anti-tipping mechanism.

The key hole 76 as shown in FIG. 6B is a roughly rectangular shape formed from two arcs of the same radius as the cap hole 75, and two straight lines parallel with each other. The key hole 76 and the lock plate 68 are approximately similar shapes.

The lock plate 68 inserts into the cap hole 75 by way of the key hole 76 (See FIGS. 6A, 6B) and the boat lock shaft 66 rotates (See FIG. 6C) by a specified angle (90 degrees in the drawing) relative to the boat bottom plate 59 so that the lock plate 68 engages with the key hole 76. By latching in this way, the boat placement plate 44 locks with the boat bottom plate 59 to prevent moving apart, or in other words the boat 13 is locked and does not tip over.

The positioning pin 61 and the tapered groove 58 engage with each other as described above to set the rotation direction position of the boat 13 relative to the boat placement plate 44.

In a state where the lock rod 73 is not contacting the level surface 69, the initial spring force of the lock spring 71, and the stopper between the boat lock shaft 66 and the external swivel axis 56 set the rotation direction position of the boat lock shaft 66 versus the boat placement plate 44.

The direction of the lock plate 68 is 90 degrees from the direction of the key hole 76 on the boat bottom plate 59 of the boat 13 mounted on the boat placement plate 44, in a state where the boat lock shaft 66 is not engaged with the lock rod 73 (See FIG. 6A and FIG. 6B).

The boat placement plate 44 releasing and locking the boat is described in FIG. 7A, FIG. 7B and FIG. 7C.

The case where the boat 13 is mounted on the boat placement plate 44 is described first.

To prepare for mounting the boat 13, the lock actuator 74 is operated to make the lock rod 73 protrude and abut against the level surface 69. The lock rod 73 abutting against the level surface 69 locks the rotation of the boat lock shaft 66.

In a state where the rotation of the boat lock shaft 66 is locked, the boat rotation motor (not shown in drawing) is driven and the boat placement plate 44 is rotated 90 degrees relative to the lock plate 68 by way of the worm 64, worm wheel 63, external swivel shaft 56 and the boat swivel shaft 43. The boat placement plate 44 rotates in a direction that further deflects the lock spring 71.

The boat 13 position and direction are set relative to the boat placement plate 44. The direction of the key hole 76 of the boat bottom plate 59 for the boat 13 at this time matches the direction of the lock plate 68 (See FIG. 7A).

The boat 13 is then mounted on the boat placement plate 44. The lock plate 68 is inserted by way of the key hole 76 into the cap hole 75 (See FIG. 7B).

The boat rotation motor (not shown in drawing) is driven opposite the above rotation direction. The boat lock shaft 66 rotation is still locked by the lock rod 73. The boat placement plate 44 is rotated 90 degrees relative to the lock plate 68 in the reverse direction. The rotation direction restores the lock spring 71.

The lock actuator 74 makes the lock rod 73 retract when the boat placement plate 44 is rotated 90 degrees in the reverse direction. The boat lock shaft 66 sets the rotation direction position with the stopper (not shown in drawing).

In this state, the lock plate 68 direction is 90 degrees different from the key hole 76 direction as described above. The lock plate 68 is engaged with the key hole 76 or in other words, the boat 13 is locked (See FIG. 7C).

In a state where the boat lock shaft 66 has been released from the lock state by the lock rod 73, the lock spring 71 joins the boat lock shaft 66 and the boat bottom plate 59 into one unit. The boat rotation motor (not shown in drawing) rotates the boat bottom plate 59 to keep the boat 13 locked during rotation.

The boat 13 is in this way kept lock on the boat placement unit 12 while the boat exchanger device 14 transferring other boats, while the wafers are being exchanged, and while the boat 13 is rotating and the wafers are being processed after the boat 13 was loaded into the reaction furnace 11.

The release operation of the locking in the boat placement plate 44 is performed by an operation that is the reverse of the above described locking operation.

The lock plate 68 can also be reset relative to the boat placement plate 44, by making the lock rod 73 retract so that the lock spring 71 is restored making the boat lock shaft 66 rotate in reverse.

However, sudden rotation and stopping of the boat lock shaft 66 might cause particle emissions. The boat rotation motor preferably returns the boat lock shaft 66 slowly as mentioned above.

Figure 8:
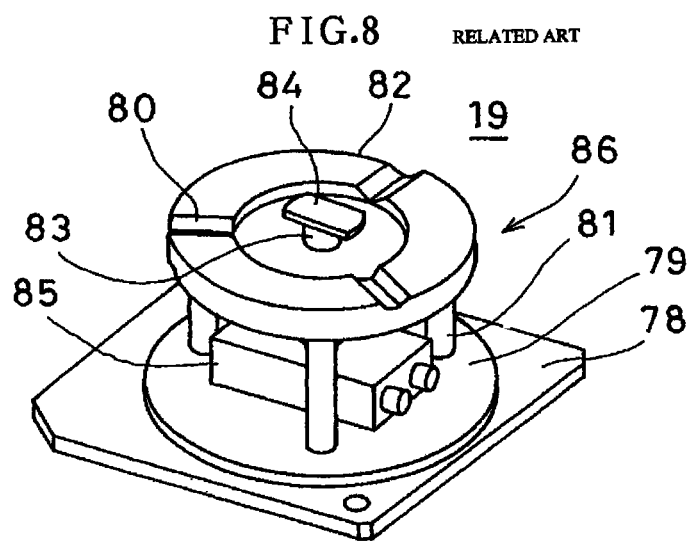
FIG. 8 is a perspective view showing an example of the boat stand utilized in the substrate processing apparatus of the present invention.
Figure 9:
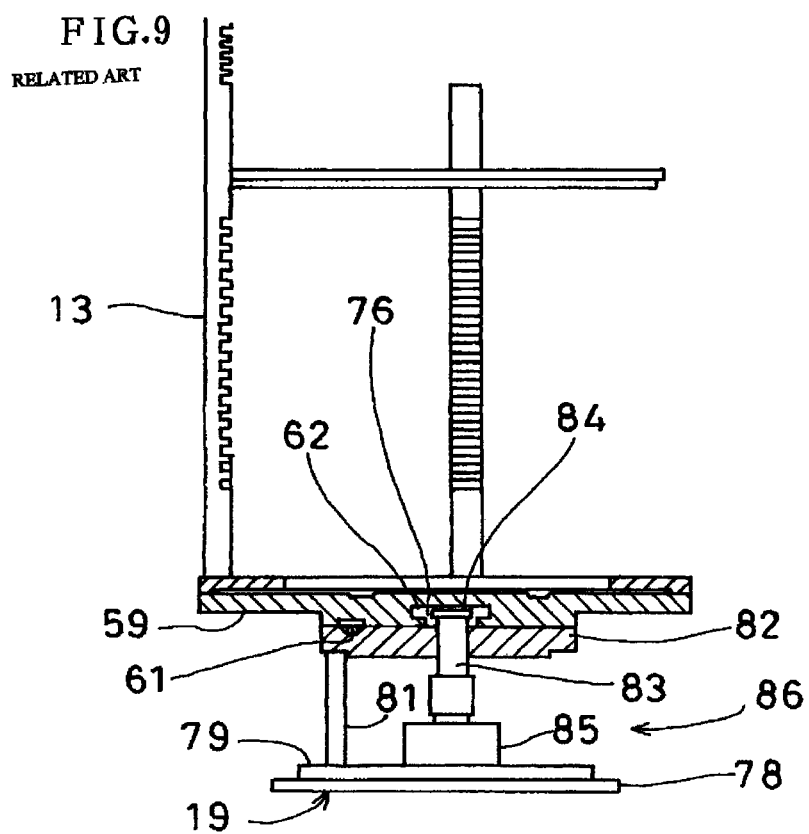
FIG. 9 is a side cross sectional view of the boat stand.
Figure 10:
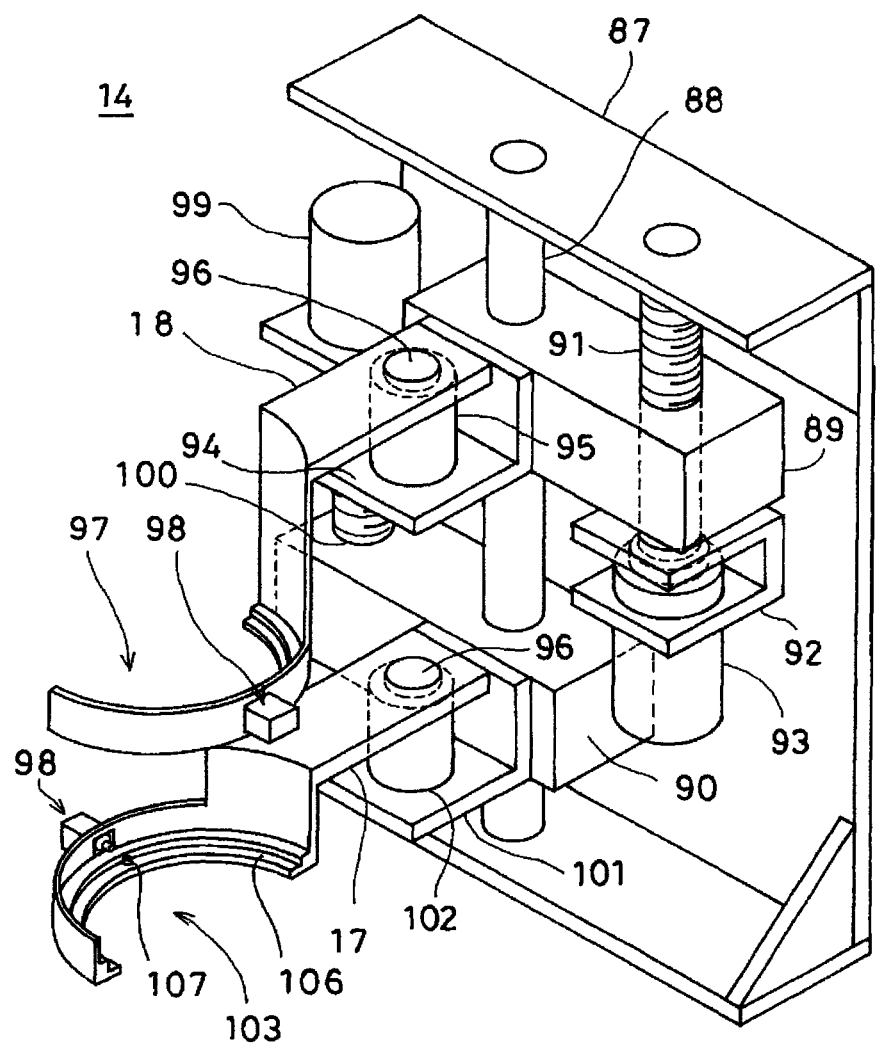
FIG. 10 is a perspective view showing an example of the boat exchanger device utilized in the substrate processing apparatus of the present invention.

The boat stand 19 is described next while referring to FIG. 8 and FIG. 9.

The boat stand 20 is the same structure as the boat stand 19.

A seat plate 79 is clamped to a base 78 installed on the case 1. A support pillar 81 is erected on the seat plate 79. A boat mount seat 82 is installed on the support pillar 81. Three tapered grooves 80 are formed along the radius on the upper surface of the boat mount seat 82. The tapered groove 80 engages with the positioning pin 61 of the boat 13.

A lock shaft 83 is installed along the center line of the boat mount seat 82. A lock plate 84 of the same shape as the lock plate 68 is fastened to the protruding top end of the lock shaft 83.

A rotary actuator 85 such as a rotating cylinder or motor or rotary solenoid is connected to the bottom end of the lock shaft 83. The rotary actuator 85 rotates the lock plate 84 ninety degrees via the lock shaft 83.

The boat 13 is mounted on the boat mount seat 82.

The tapered groove 80 engaging with the positioning pin 61 determines the boat 13 attitude versus the boat mount seat 82. The direction the key hole 76 faces, matches the lock plate 84 direction in this state. The lock plate 84 therefore inserts into the cap hole 75 by way of the key hole 76.

After mounting the boat 13 on the boat mount seat 82, the rotary actuator 85 is driven to rotate the lock plate 84 ninety degrees. The boat 13 is in this way locked on the boat mount seat 82 so that the boat 13 is prevented from tipping over.

The boat anti-tipping mechanism 86 that functions as a substrate holding jig movement suppression mechanism includes the rotary actuator 85, the lock shaft 83, and the lock plate 84, etc.

The boat 13 is locked and prevented from tipping over in the state while held in the boat elevator 7, or even while held in the boat stand 19 and the boat stand 20.

The boat 13 may be locked in either case while held in the boat elevator 7, or while held in the boat stand 19 and the boat stand 20.

The boat exchanger device 14 and the boat anti-tipping mechanism 98 in the boat exchanger device 14 are described next while referring to FIG. 10 through FIG. 13.

A frame 87 whose vertical cross section is a square shape open on the left side is installed on the base (not shown in drawing) of the case 1. A guide shaft 88 is installed extending perpendicularly in the frame 87. A right up and down block 89 and a left up and down block 90 for operation are installed on the guide shaft 88.

A screw shaft 91 screws into the right up and down block 89. The screw shaft 91 is installed parallel with the guide shaft 88. A bearing member 92 attached to the frame 87 supports the bottom end of the screw shaft 91. A right elevator motor 93 is installed on the bearing member 92. The right elevator motor 93 rotates the screw shaft 91.

An L-shaped bracket 94 is attached to the front surface of the right up and down block 89. A rotary actuator 95 such as a rotary cylinder is installed on this bracket 94. The right boat support arm 18 is attached to a rotating shaft 96 of the rotary actuator 95. The right elevator motor 93 raises and lowers the right boat support arm 18. The rotary actuator 95 swivels the right boat support arm 18.

The tip of the right boat support arm 18 is a right boat placement unit 97. This right boat placement unit 97 includes the boat anti-tipping mechanism 98 as described later.

The left boat support arm 17 is the same mechanism as the right boat support arm 18 and also capable of being raised, lowered and rotated.

Namely, the left up and down block 90 is screwed into a screw shaft 100 rotated by the left elevator member 99. A rotary actuator 102 is installed by way of a bracket 101 in the left up and down block 90. The left boat support arm 17 is installed in the rotary actuator 102. The tip of this left boat support arm 17 also forms a left boat placement unit 103. This left boat placement unit 103 along with the right boat placement unit 97 includes the boat anti-tipping mechanism 98.

The left boat placement unit 103 is symmetrical with the right boat placement unit 97.

The boat exchange control unit 50 controls the right elevator motor 93, the rotary actuator 95, the left elevator motor 99 and the rotary actuator 102 by controlling the drive such as the operation timing and the operation speed.

Figure 11:
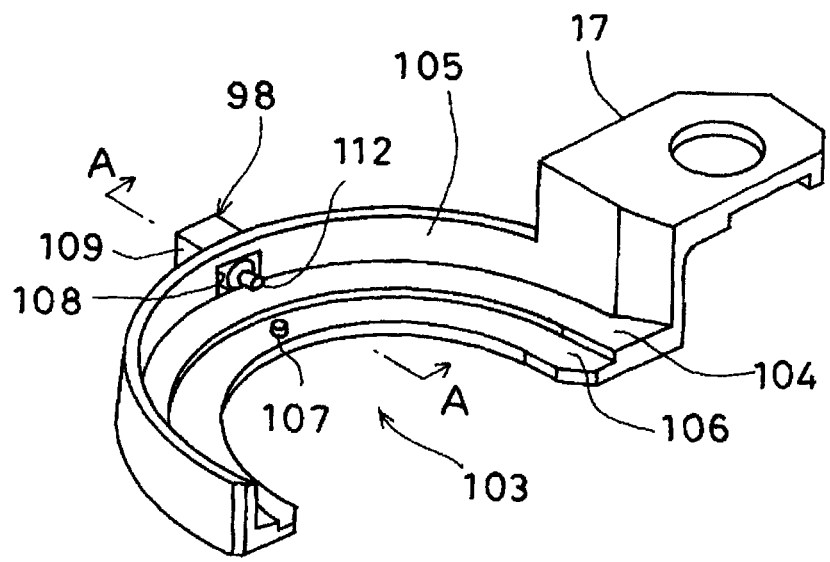
FIG. 11 is a perspective view of the boat placement unit in the boat exchanger device.
Figure 12:
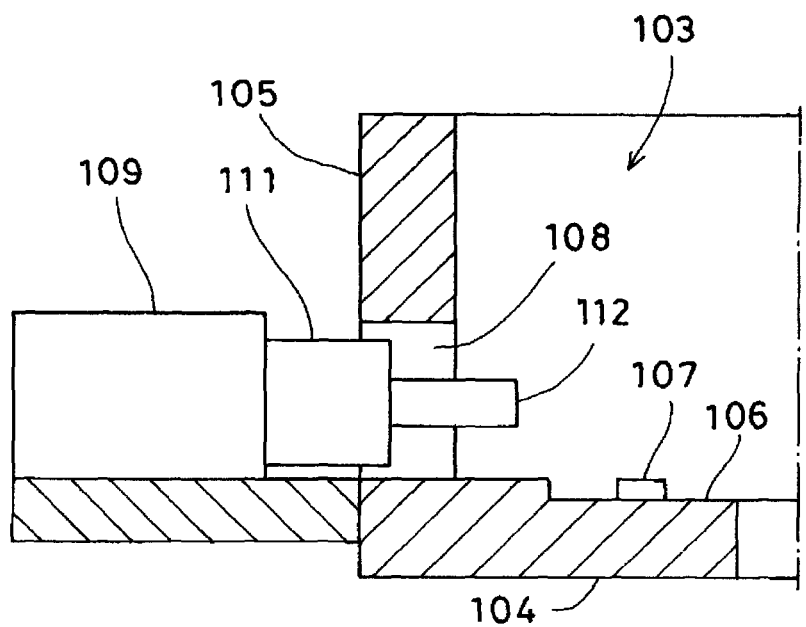
FIG. 12 is a drawing taken along the line A-A in FIG. 11 showing the boat anti-tipping mechanism in the boat exchanger device.

The boat anti-tipping mechanism 98 and the left boat placement unit 103 are described using FIG. 11 and FIG. 12.

These figures show the boat anti-tipping mechanism 98 installed on the left boat support arm 17.

The left boat placement unit 103 is formed in a roughly semicircular arc shape. The cross sectional shape of the left boat placement unit 103 includes a horizontal rack unit 104 and a perpendicular wall 105. The rack unit 104 contains a step 106 for mounting the boat 13.

The boat anti-tipping mechanism 98 is installed at a position in the approximate center of the circular arc shape of the left boat placement unit 103. This boat anti-tipping mechanism 98 constitutes a substrate holding jig movement suppression mechanism to suppress horizontal and vertical movement of the substrate holding jig in order to keep the substrate holding jig on the placement unit of the substrate holding jig movement mechanism.

As shown in FIG. 11, the boat anti-tipping mechanism 98 contains a perpendicular pin 107 as placement surface projection disposed at a position facing a perpendicular cavity 115 serving as the lower surface cavity of the boat 13 when the boat 13 is mounted on the rack unit 104; and a horizontal pin 112 as a side surface projection disposed at a position facing a horizontal cavity 116 as the side surface cavity of the boat 13; and a linear actuator 109 serving as a projection shifter mechanism to move the horizontal pin 112 from the outer side of the horizontal cavity 116 to inside or outside the interior of the horizontal cavity 116.

This horizontal pin 112 is formed in a cylindrical pin shape and installed so as to protrude coaxially on the tip surface of a piston rod 111 of the linear actuator 109. The horizontal pin 112 can insert into the horizontal cavity 116.

A through hole 108 is formed on the wall 105. An installation base is provided radially outward at a section of the through hole 108 on the outer circumference of this wall 105. The linear actuator 109 is installed on this installation base so that the piston rod 111 faces radially inward.

The vertical pin 107, the horizontal pin 112 and the linear actuator 109 are positioned 90 degrees relative to the left boat support arm 17 or namely are all arrayed along the rotation direction of the left boat support arm 17. In other words, the vertical pin 107, the horizontal pin 112 and the linear actuator 109 are arrayed in a straight line towards the center of the left boat placement unit 103.

The dimensional relation of the horizontal pin 112 and the vertical pin 107 is described next while referring to FIG. 13A, FIG. 13B, and FIG. 13C.

In FIG. 13C, Ls is the length of the horizontal pin 112 inserted into the horizontal cavity 116 while the boat 13 is mounted perpendicularly on the left boat placement unit 103; $C_s$ is the distance between the boat 13 and the lower section of the horizontal pin 112; $R_p$ is the distance from the horizontal center on the bottom side of the boat 13 to the vertical pin 107; $r_p$ is the radius of the vertical pin 107, and R is the radius of the bottom side of the boat 13.

If the boat 13 is tilted opposite the direction shown in FIG. 13C or in other words, towards the inner side of the boat 13 radius, then the boat tilt is smaller than the angle .theta., so only the case where tilted in the direction in FIG. 13C is considered here.

If the boat 13 is tilted until the boat 13 contacts the horizontal pin 112 at the point P, then the tilt angle .theta. when the boat 13 is tilted will be the relation:

$$C_s/L_s = \tan \theta \tag{1}$$

If the height where the boat 13 engages the vertical pin 107 is set as L at this time, then the vertical pin will release from the boat 13 when $L > L_p$.

When an external force is applied to the horizontal center side of the bottom side of the boat 13 while the vertical pin 107 is released, then the vertical pin 107 will be completely released from the perpendicular cavity 115.

Here, L utilizes the relation $\tan \theta = L/(R - R_p - r_p)$ so $$L = (R - R_p - r_p) \tan \theta \tag{2}$$

is obtained, and along with (1), yields $$L = (R - R_p - r_p) C_s / L_s = \tag{3}$$

This formula signifies that the nearer $R + R_p$ is to R, or in other words, the more the vertical pin 107 position is to the outer side along the radius in the bottom surface of the boat 13, the smaller the L.

Also, the smaller the $C_s$ (the shorter the distance between the lower section of the horizontal pin 112 and the boat 13), and the smaller the L will become.

Also, the longer the Ls (the longer the length of the horizontal pin 112 inserted in the horizontal cavity 116 of the boat 13), the smaller the L will become.

Figure 14A:
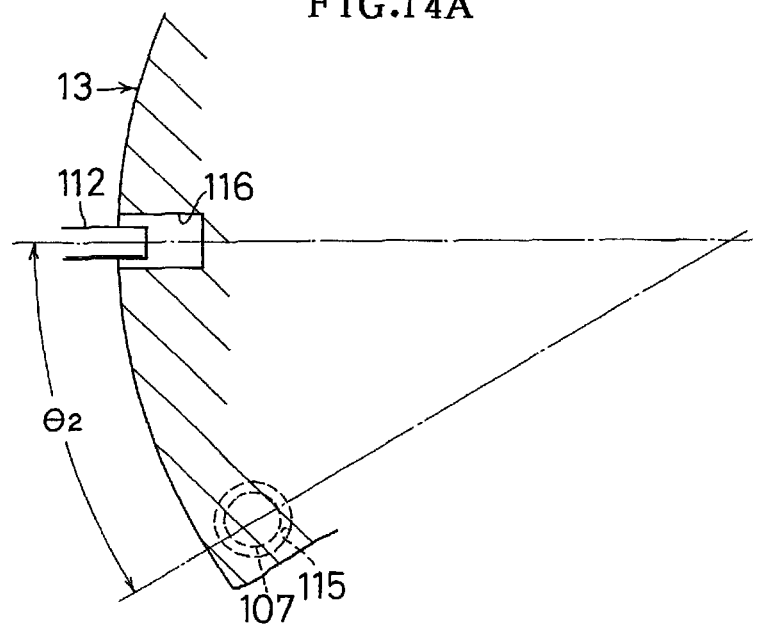
FIG. 14A is a plan cross sectional view for illustrating the dimensional relation when the peripheral direction phase of the horizontal pin and the perpendicular projection have deviated from one another.
Figure 14B:
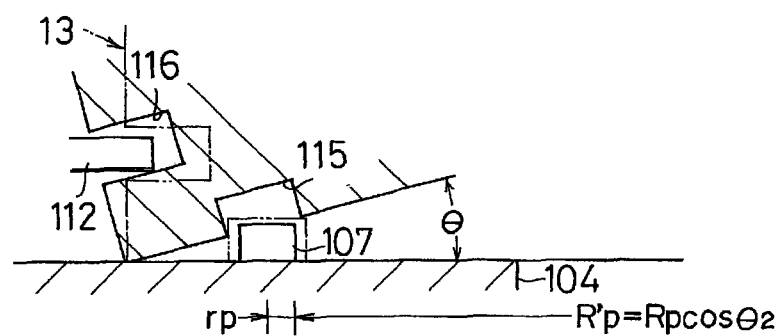
FIG. 14B is a diagrammatic view for illustrating the dimensional relation when the peripheral direction phase of the horizontal pin and the perpendicular projection have deviated from one another.

The above relation is the case where the vertical pin 107 and the horizontal pin 112 have the same angle along the radius in the bottom side of the boat 13. However, as shown in FIG. 14A, the relation is the same even with a different angle .theta.2.

In this case, the Rp in the formula (3) becomes $R_{p'}$, and $R_{p'} = R_p \cos \theta_2$.

For example, when $\theta_2 = 90$ degrees, then $\cos \theta_2$ is 0 so $L = (R - r_p) C_s / L_s$ is obtained.

The L here is long compared to the formula (3) so the $L_p$ must be made long to prevent the vertical pin 107 from coming out.

In other words, the larger the .theta.2, the longer the vertical pin 107 must be made, and if setting the vertical pin 107 to a minimum length is desired, then the $\theta_2$ may be set to zero.

The inner diameter of the perpendicular cavity 115 of the boat 13 is not used in the above calculation but if there is a difference between the inner diameter of the perpendicular cavity 115 and the outer diameter of the vertical pin 107, then that difference may be applied as needed to find a result in the above calculation.

The operation of the boat anti-tipping mechanism 98 is described next while referring to FIG. 1, FIG. 2, FIG. 15A, FIG. 15B, and FIG. 15C.

If the left boat support arm 17 is receiving the boat 13 for example at the wafer cooling position C, then the rotary actuator 102 rotates the left boat support arm 17 at the boat stand 20.

At this time, the left elevator motor 99 lowers the left boat support arm 17 so that the left boat support arm 17 will not interfere with the boat 13 to be received.

The perpendicular cavity 115 and the vertical pin 107 centers align while the left boat placement unit 103 center matches the center of the boat 13, and the centers of horizontal pin 112 and horizontal cavity 116 then align.

The piston rod 111 is retracted at this time.

The left elevator motor 99 first of all rotates the screw shaft 100, so that the left up and down block 90 is raised along the guide shaft 88 to make the left boat support arm 17 rise as shown in FIG. 15A. The rack unit 104 of the left boat placement unit 103 receives the boat 13 as shown in FIG. 15B. In other words, the boat 13 is mounted relative to the left boat placement unit 103.

As shown in FIG. 15B, the vertical pin 107 of the left boat placement unit 103 is inserted into the vertical cavity 115 of the boat 13.

The linear actuator 109 then operates as shown in FIG. 15C so that the horizontal pin 112 on the tip of the piston rod 111 is inserted into the horizontal cavity 116 of the boat 13.

Inserting the perpendicular pin 107 into the vertical cavity 115 restricts the horizontal movement of the boat 13.

Also, inserting the horizontal pin 112 into the horizontal cavity 116, restricts the vertical movement of the boat 13 or in other words suppresses perpendicular movement.

Inserting the perpendicular pin 107 into the vertical cavity 115, and inserting the horizontal pin 112 into the horizontal cavity 116 also acts to restrict rotation movement centering on the perpendicular pin 107 of the boat 13 but mounting the boat 13 on the step 106 is more preferable since it restricts the rotation movement centering on the perpendicular pin 107 to an even greater degree.

Movement is therefore restricted in three directions (vertical, horizontal, rotational) if a horizontal force acts on the boat 13 while the boat anti-tipping mechanism 98 is functioning.

Rotational movement can also be restricted by positioning the wall 105 near the boat 13, and abutting the wall 105 against the boat 13.

Rotating the rotating shaft 96 makes the left boat support arm 17 and the boat 13 rotate 90 degrees, and transfers the boat 13 to the boat delivering and receiving position B.

While transferring the boat 13, the perpendicular pin 107 of the left boat placement unit 103 is inserted into the vertical cavity 115 of the boat 13, and the horizontal pin 112 is inserted into the horizontal cavity 116 of the boat 13 to securely prevent the boat 13 from tipping over during transferring.

The boat delivering and receiving position B is directly below the process furnace 11, so that the left boat placement unit 103 is set to a position matching the up and down arm 8, the seal cap 9 and the boat placement plate 44.

The boat 13 is mounted on the boat placement plate 44 when the left boat placement unit 103 lowers.

The linear actuator 109 in the left boat placement unit 103 then operates, and the horizontal pin 112 on the tip of the piston rod 111 is pulled from the horizontal cavity 116 of the boat 13.

When the left boat placement unit 103 then lowers even further, the vertical pin 107 of the left boat placement unit 103 is pulled from the vertical cavity 115 of the boat 13, and the left boat placement unit 103 is detached from the boat 13. The boat 13 is in other words transferred to the boat placement plate 44 of the seal cap 9.

Rotating the left boat support arm 17 ninety degrees in the reverse direction, returns the boat placement unit 103 to the wafer transfer position A.

The method for forming a thin film on the wafer 10 by the CVD technique which is one process in the IC manufacturing method is described next utilizing the process furnace 11 described previously.

In the following description, the main control unit 51 controls the operation of each unit in the substrate processing apparatus.

The substrate transfer device 15 charges a specified number of wafers 10 into the boat 13 mounted on the boat stand 19 (wafer transfer position A).

The boat 13 mounted on the boat stand 19 is locked by the boat anti-tipping mechanism 86 via the lock plate 84 locked to the lock hole 62.

When charging the wafers 10 into the boat 13 is finished, the boat 13 at the wafer transfer position A is delivered from the boat stand 19 to the left boat support arm 17. The left boat support arm 17 transfers the boat 13 to the boat placement unit 12 (boat delivering and receiving position B).

During the process for delivering the boat 13 from the boat stand 19 to the left boat support arm 17, the boat anti-tipping mechanism 98 in the left boat support arm 17 operates to lock the boat 13 in a state where the boat anti-tipping mechanism 86 in the boat stand 19 has locked the boat 13.

The lock of the boat anti-tipping mechanism 86 is released after the boat anti-tipping mechanism 98 has completely locked the boat 13. Therefore, during delivery of the boat 13, the boat 13 is simultaneously locked by the boat anti-tipping mechanism 86 and the boat anti-tipping mechanism 98, and the anti-tipping control unit 49 controls the operation timing of the boat anti-tipping mechanism 86 and the boat anti-tipping mechanism 98 so that the boat 13 will not become unlocked.

The same action also occurs at the boat delivering and receiving position B, where transferring the boat 13 from the left boat support arm 17 to the boat placement unit 12. The boat placement plate 44 accepts the boat 13 while the boat 13 is locked by the boat anti-tipping mechanism 98. Moreover, the boat anti-tipping mechanism 77 operates to lock the boat 13.

The lock of the boat anti-tipping mechanism 98 is released after the boat anti-tipping mechanism 77 has completely locked the boat 13. In this case also, the anti-tipping control unit 49 controls the operation timing of the boat anti-tipping mechanism 98 and the boat anti-tipping mechanism 77 so that the boat 13 will not become unlocked.

When transfer to the boat placement unit 12 is finished, the boat elevator 7 raises the boat 13 and loads it into the processing chamber 26.

The vacuum exhaust apparatus 39 exhausts the interior of the processing chamber 26 so as to reach the desired, specified pressure (vacuum intensity). In this case, the pressure sensor 37 measures the pressure in the processing chamber 26, and the pressure adjuster device 38 regulates the pressure based on the pressure measurement.

The heater 21 heats the processing chamber 26 to reach the specified, desired temperature. In this case, the electrical power level to the heater 21 is regulated on the basis of temperature measurement information detected by the temperature sensor 47 so that the processing chamber 26 reaches a specified temperature distribution.

The boat swivel mechanism 42 rotates the boat 13, which rotates the wafers 10.

Next, the MFC 34 controls gas from the process gas supply source at the specified flow rate. The gas flows in the gas supply pipe 33 and is supplied into the processing chamber 26 from the nozzle 32.

The gas supplied into the processing chamber 26 rises, and flows out from the top end opening of the internal reaction tube 24 into the space 27 and is exhausted from the exhaust pipe 36.

While passing through the inside of the processing chamber 26, the gas makes contact with the surface of the wafers 10, so that a thin film is deposited on the surface of the wafer 10 at this time by a thermal CVD reaction.

After a preset processing time has elapsed, inert gas is supplied from the inert gas supply source, and along with filling the inert gas into the processing chamber 26 instead of the process gas, the pressure inside the processing chamber 26 is restored to normal pressure.

The boat elevator 7 then lowers the seal cap 9 and along with opening the bottom end of the manifold 28, the processed wafers 10 held in the boat 13 are unloaded outside the reaction tube 23 from the bottom end of the manifold 28.

The processed wafers 10 are then discharged from the boat 13.

Processing conditions specified for processing wafers in the process furnace of the embodiment of this invention when forming for example an SiN film are specified as: a processing temperature of 760° C., a processing pressure of 20 to 25 Pa, ammonia ($NH_3$) gas as the gas type, a gas supply flow rate of 480 sccm, dichlorosilane (DCS) gas as the gas type, and a gas supply flow rate of 120 sccm. Wafers were processed while maintaining the values for these specified processing conditions within their respective range.

After processing ends, the boat elevator 7 lowers the boat 13, and the boat 13 is transferred at the boat delivering and receiving position B, from the boat placement unit 12 to the right boat support arm 18.

In that case, the boat 13 is mounted onto the right boat support arm 18 while locked by the boat anti-tipping mechanism 77. The lock of the boat anti-tipping mechanism 77 is released after the boat anti-tipping mechanism 98 has completely locked the boat 13.

The anti-tipping control unit 49 therefore regulates the operation timing of the boat anti-tipping mechanism 77 and the boat anti-tipping mechanism 98 so that the boat 13 does not reach an unlocked state.

Even if the boat 13 is transferred from the right boat support arm 18 to the boat stand 20, this anti-tipping control unit 49 regulates the operation timing of the boat anti-tipping mechanism 98 and the boat anti-tipping mechanism 86 so that there is no unlocked state for the boat 13.

The following effects are rendered by the embodiments.

1) The effect is rendered that the manufacturing productivity in the IC manufacturing method by the vertical diffusion CVD apparatus can be improved since the boat is reliably prevented from tipping over during transfer by installing a boat anti-tipping mechanism as a boat movement suppression mechanism in the left boat placement unit and the right boat placement unit, and inserting a vertical pin in the boat anti-tipping mechanism into a vertical cavity of the boat, and inserting a horizontal pin into a horizontal cavity of the boat while the left boat placement unit and the right boat placement unit are transferring the boat.

2) The effect is rendered that the manufacturing productivity in the IC manufacturing method by the vertical diffusion CVD apparatus can be improved since the boat is reliably prevented from tipping over even if an unmeasured external force is applied due to an earthquake or faulty operation or human error, because a boat anti-tipping mechanism is installed in the left boat placement unit and the right boat placement unit, and a vertical pin in the boat anti-tipping mechanism is inserted into a vertical cavity of the boat, and a horizontal pin is inserted into a horizontal cavity of the boat while the left boat placement unit and the right boat placement unit are holding the boat.

3) The effect is rendered that tipping over or damaging the boat can be prevented even if a horizontal force is applied to the boat by an external impact by such as an earthquake, because the boat will not set to an unlocked state, whatever state the boat is in during processing.

4) The effect is rendered that tipping over of the substrate holding jig is prevented even when an unforeseen external force is applied to the substrate holding jig since there is no state where the substrate holding jig is not linked because either of the substrate holding jig anti-tipping mechanisms is linked to the substrate holding jig while the substrate processing apparatus is in operation, in an aspect of the substrate processing apparatus including: a processing chamber for storing and processing a substrate, a substrate holding jig for holding the substrate in the processing chamber, a placement unit on which the substrate holding jig is mounted, for moving the substrate holding jig inside and outside the processing chamber, a first substrate holding jig anti-tipping, mechanism capable of linking and releasing to prevent the substrate holding jig mounted on the placement unit from tipping over, a substrate holding jig movement mechanism capable of moving the substrate holding jig to a location different from the placement unit, a second substrate holding jig anti-tipping mechanism capable of linking and releasing to prevent the substrate holding jig mounted on the substrate holding jig movement mechanism from tipping over, and an anti-tipping control unit to control the linking and releasing of the first and the second substrate holding jig anti-tipping mechanisms; and this anti-tipping control unit controls the operation so that at least one of the first and the second substrate holding jig anti-tipping mechanisms is linked with the substrate holding jig while the substrate holding jig is being transferred between the placement unit and the substrate holding jig movement mechanism, to prevent the substrate holding jig from tipping over.

5) The effect is rendered that excellent results such as preventing the substrate holding jig from tipping over are attained even when an unforeseen external force is applied to the substrate holding jig since there is no state where the substrate holding jig is not linked because either of the substrate holding jig anti-tipping mechanisms is linked to the substrate holding jig while the substrate processing apparatus is in operation, in an aspect of the substrate processing apparatus including: a processing chamber for storing and processing a substrate, a substrate holding jig for holding the substrate in the processing chamber, a placement unit on which the substrate holding jig is mounted, for moving the substrate holding jig inside and outside the processing chamber, a holding stand for holding the substrate holding jig positioned at a location different from the placement unit, a first substrate holding jig anti-tipping mechanism capable of linking and releasing to prevent the substrate holding jig mounted on the holding stand from tipping over, a substrate holding jig movement mechanism capable of moving the substrate holding jig between the placement unit and the holding stand, a second substrate holding jig anti-tipping mechanism capable of linking and releasing to prevent the substrate holding jig mounted on the substrate holding jig movement mechanism from tipping over, and an anti-tipping control unit to control the linking and releasing of the first and the second substrate holding jig anti-tipping mechanisms; and this anti-tipping control unit controls the operation so that at least one of the first and the second substrate holding jig anti-tipping mechanisms is linked with the substrate holding jig while the substrate holding jig is being transferred between the holding stand and the substrate holding jig movement mechanism, to prevent the substrate holding jig from tipping over.

Figure 16:
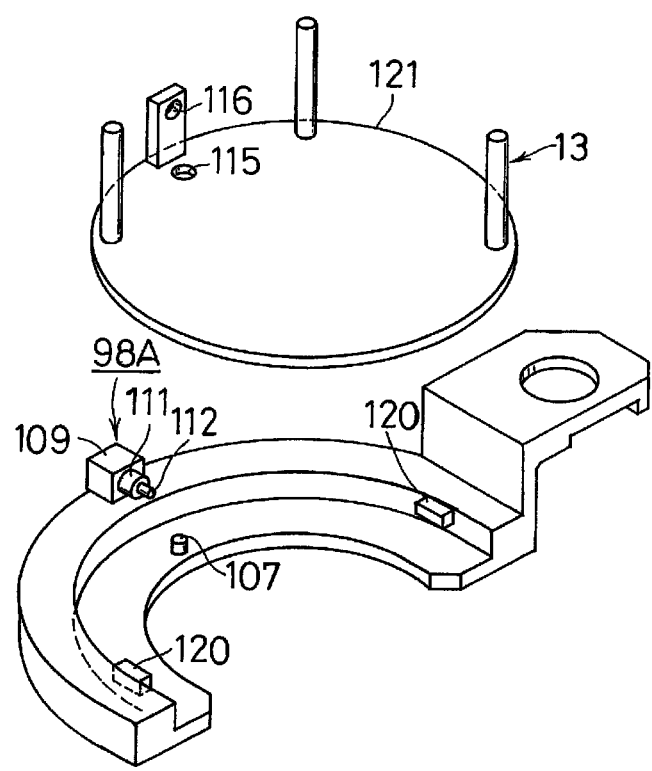
FIG. 16 is a perspective view showing the boat anti-tipping mechanism in the vertical diffusion CVD apparatus of another embodiment of the present invention.

FIG. 16 is a perspective view showing the boat anti-tipping mechanism in the vertical diffusion CVD apparatus of another embodiment of the present invention.

This embodiment differs from the previous embodiment in the point that the boat anti-tipping mechanism 98A serving as the substrate holding jig movement suppression mechanism contains two boat clamps 120 serving as substrate holding jig clamps.

In this embodiment, besides inserting the vertical pin 107 in the boat anti-tipping mechanism 98A into the perpendicular cavity 115 of the boat 13 and inserting the horizontal pin 112 into the horizontal cavity 116 of the boat 13, two boat clamps 120 at linearly symmetrical positions from the center line of the horizontal pin 112 can clamp the periphery of the base plate 121 of the boat 13 at two locations from above or from the side so that tipping over of the boat 13 is even more securely prevented.

The boat clamps 120 are preferably respectively installed on the base plate 121 periphery, at positions intersecting a straight line joining the centers of the base plate 121 and the horizontal pin 112 so that tipping over of the boat 13 is even more securely prevented.

The present invention is not limited to these embodiments and needless to say, all manner of variations and adaptations not departing from the spirit and scope of this invention are allowable.

The boat anti-tipping mechanism serving as the boat movement suppression mechanism is not limited to be installed in a swing arm type boat exchanger device.

Figure 17:
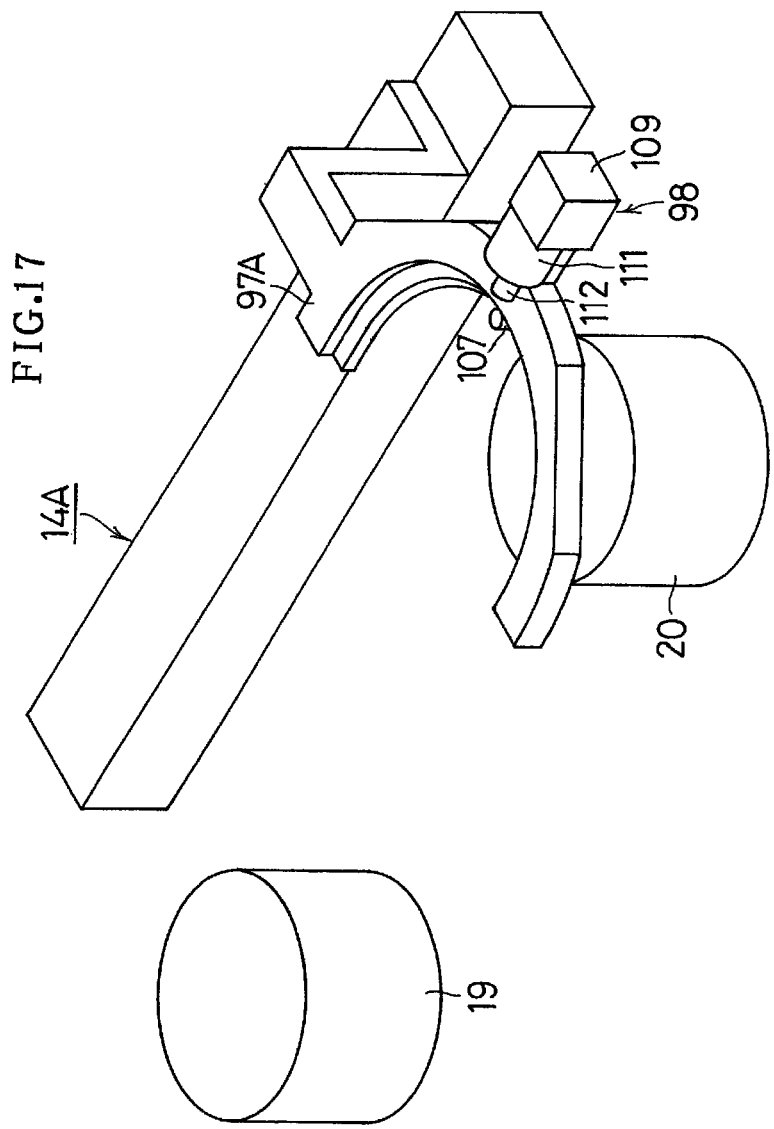
FIG. 17 is a perspective view showing an embodiment where the boat anti-tipping mechanism is installed in the linear type boat exchanger device.

The boat anti-tipping mechanism may for example be installed in a boat placement unit 97A for linear type boat exchanger device 14A as shown in FIG. 17.

Figure 18:
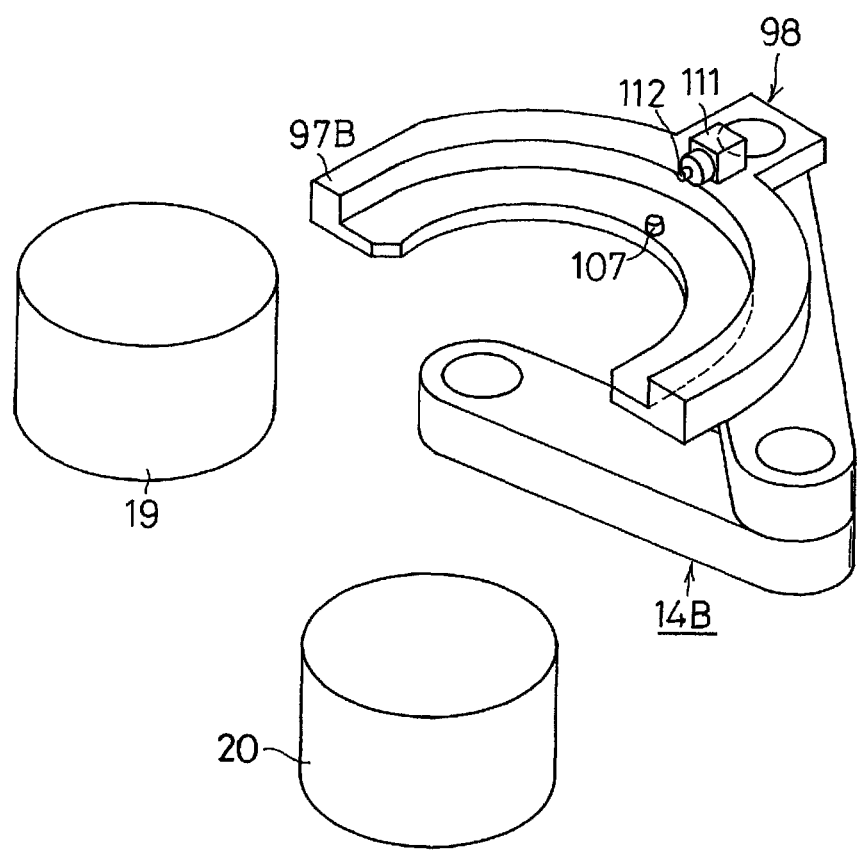
FIG. 18 is a perspective view showing an embodiment where the boat anti-tipping mechanism is installed in a SCARA type robot.

Also, as shown in FIG. 18, the boat anti-tipping mechanism may be installed in a boat placement unit 97B attached on the arm in the final section of the SCARA type robot (selective compliance assembly robot arm) 14B.

The drive means for advancing and retracting the horizontal pin of the boat anti-tipping mechanism serving as the boat movement suppression mechanism, is not limited to an air cylinder device, and an actuator such as an electrically driven motor or electromagnetic plunger may be used.

The boat anti-tipping mechanisms serving as the boat movement suppression mechanism may be installed at two locations in the boat placement unit.

The arms supporting the two boat placement units may each rotate 180 degrees, and the boats may be supported by the boat placement unit at the boat standby position without installing a standby boat placement stand at the boat standby position. Boats may be given and received at the boat delivering and receiving position by raising and lowering of the boat elevator.

An one-piece boat 13 was shown as the substrate holding jig, but needless to say, a structure where the boat is divided in a lower section, or the boat is mounted on the boat placement unit 12 by way of a holding member may be utilized.

Typical aspects of the invention other than the above aspect (1) as a measure for resolving the problems are described next.

(2) A substrate processing apparatus according to the above aspect (1), wherein a lower surface cavity (perpendicular cavity) is formed on the lower surface of the substrate holding jig, and a side surface cavity (horizontal cavity) is formed on the side surface of the substrate holding jig, the substrate holding jig movement suppression mechanism includes a placement surface projection (vertical pin) disposed at a position facing the lower surface cavity when the substrate holding jig is mounted on the placement surface of the placement unit, and a projection shifter mechanism (linear actuator) installed at a position facing the side surface cavity and capable of moving from outside the side surface cavity in and out of the side surface cavity.

(3) A substrate processing apparatus according to the above aspect (2), wherein the substrate holding jig movement suppression mechanism further includes multiple substrate holding jig clamps.

(4) A substrate processing apparatus according to the above aspects (1), (2) or (3), wherein the substrate holding jig movement suppression mechanism is installed to prevent the substrate holding jig from tipping over while the substrate holding jig is mounted in the placement unit.

What is claimed is:

1. A substrate processing apparatus comprising:
    a processing chamber for storing a substrate and performing a specified processing on the substrate,
    a substrate holding jig for holding the substrate in the processing chamber,
    a placement stand arranged to move the substrate holding jig inside and outside the processing chamber while mounting the substrate holding jig,
    a substrate holding jig movement mechanism arranged to move horizontally the substrate holding jig to a location different from the placement stand while holding the substrate holding jig, and
    a substrate holding jig movement suppression mechanism arranged to suppress vertical and horizontal movement of the substrate holding jig in order to keep the substrate holding jig mounted on a placement unit of the substrate holding jig movement mechanism, wherein the placement unit has a horizontal rack unit and a perpendicular wall, wherein the substrate holding jig movement suppression mechanism includes at least a side surface projection, formed in the perpendicular wall, capable of moving horizontally inside and outside of a side surface cavity formed on the side surface of the substrate holding jig, and a placement surface projection, formed in the horizontal rack unit, which inserts into a lower surface cavity formed on the underside of the substrate holding jig, wherein the side surface projection maintains a state that has been inserted into the side surface cavity when the substrate holding jig movement mechanism transfers the substrate holding jig.

2. A substrate processing apparatus according to claim 1, wherein the substrate holding jig movement suppression mechanism further includes multiple substrate holding jig clamps.

3. A substrate processing apparatus according to claim 1, wherein the substrate holding jig movement suppression mechanism is installed to prevent the substrate holding jig from tipping over while the substrate holding jig is mounted in the placement unit.

4. A substrate processing apparatus according to claim 1, wherein the side surface projection and the placement surface projection are arrayed in a straight line.

5. A semiconductor device manufacturing method for processing by utilizing the substrate processing apparatus according to claim 1, and comprising the steps of:

moving the substrate holding jig into the processing chamber from outside the processing chamber while the substrate holding jig holding the substrate is mounted onto the placement stand, storing the substrate holding jig holding the substrate inside the processing chamber and performing a specified processing, moving the substrate holding jig holding the substrate from inside the processing chamber to outside the processing chamber while the substrate holding jig is mounted on the placement stand, moving the substrate holding jig to a location different from the placement stand by the substrate holding jig movement mechanism, and keeping the substrate holding jig mounted on the placement unit by the substrate holding jig movement suppression mechanism.

6. A semiconductor device manufacturing method for processing by utilizing the substrate processing apparatus according to claim 1, and comprising the steps of:

moving the substrate holding jig into the processing chamber from outside the processing chamber while the substrate holding jig holding the substrate is mounted on the placement stand, storing the substrate holding jig holding the substrate inside the processing chamber and performing a specified processing, moving the substrate holding jig holding the substrate from inside the processing chamber to outside the processing chamber while the substrate holding jig is mounted on the placement stand, and controlling the linking of at least one of the substrate holding jig movement suppression mechanism and the substrate holding jig anti-tipping mechanism with the substrate holding jig by the anti-tipping control unit while the substrate holding jig is being transferred between the substrate holding jig movement mechanism and the placement stand to prevent the substrate holding jig from tipping over.

7. A semiconductor device manufacturing method for processing by utilizing the substrate processing apparatus according to claim 1 and comprising the steps of:

moving the substrate holding jig into the processing chamber from outside the processing chamber while the substrate holding jig holding the substrate is mounted on the placement stand, storing the substrate holding jig holding the substrate inside the processing chamber and performing a specified processing, moving the substrate holding jig holding the substrate from inside the processing chamber to outside the processing chamber while the substrate holding jig is mounted on the placement stand, moving the substrate holding jig from the placement stand to the holding stand by the substrate holding jig movement mechanism, and controlling the linking of at least one of the substrate holding jig movement suppression mechanism and the substrate holding jig anti-tipping mechanism with the substrate holding jig by the anti-tipping control unit while the substrate holding jig is being transferred between the substrate holding jig movement mechanism and the holding stand to prevent the substrate holding jig from tipping over.

8. A substrate processing apparatus comprising:

a processing chamber for storing a substrate and performing a specified processing on the substrate, a substrate holding jig for holding the substrate in the processing chamber, a placement stand arranged to move the substrate holding jig inside and outside the processing chamber while mounting the substrate holding jig, a substrate holding jig movement mechanism arranged to move horizontally the substrate holding jig to a location different from the placement stand while holding the substrate holding jig, and a substrate holding jig movement suppression mechanism arranged to suppress vertical and horizontal movement of the substrate holding jig in order to keep the substrate holding jig mounted on a placement unit of the substrate holding jig movement mechanism, wherein the substrate holding jig has a lower surface cavity formed on the underside surface of the substrate holding jig, and a side surface cavity formed on the side surface of the substrate holding jig, the substrate holding jig movement suppression mechanism is comprised of a placement surface projection formed on a horizontal rack unit of the placement unit and which inserts into the lower surface cavity when the substrate holding jig is mounted on the placement unit, and a side surface projection formed on a perpendicular wall of the placement unit and disposed at a position facing the side surface cavity and capable of moving inside and outside of the side surface cavity, wherein the side surface projection maintains a state that has been inserted into the side surface cavity when the substrate holding jig movement mechanism transfers the substrate holding jig.

* * * * *